United States Patent [19]

Cappon

[11] Patent Number: 4,651,333
[45] Date of Patent: Mar. 17, 1987

[54] SHIFT REGISTER MEMORY CELL HAVING A TRANSMISSION GATE DISPOSED BETWEEN AN INVERTER AND A LEVEL SHIFTER

[75] Inventor: Arthur M. Cappon, Chestnut Hill, Mass.

[73] Assignee: Raytheon Company, Lexington, Mass.

[21] Appl. No.: 665,486

[22] Filed: Oct. 29, 1984

[51] Int. Cl.$^4$ .......................................... G11C 19/28
[52] U.S. Cl. ................................. 377/77; 307/450; 307/481; 377/68; 377/74; 377/79; 377/105
[58] Field of Search .............. 307/450, 453, 481, 246, 307/475; 377/58, 61, 64, 68, 73-74, 77-79, 81, 105, 117; 365/187-188

[56] References Cited

U.S. PATENT DOCUMENTS

| 4,394,769 | 7/1983 | Lull ................................. 307/450 X |
| 4,418,418 | 11/1983 | Aoki ................................. 377/74 X |
| 4,441,198 | 4/1984 | Shibata et al. ..................... 377/81 X |
| 4,469,962 | 9/1984 | Snyder ............................. 307/443 X |
| 4,558,235 | 12/1985 | White et al. ....................... 307/450 |

FOREIGN PATENT DOCUMENTS

| 0092494 | 5/1984 | Japan .................................. 377/64 |
| 2120029A | 11/1983 | United Kingdom . |

OTHER PUBLICATIONS

M. Rocchi, B. Gabillard, "GaAs Digital Dynamic IC's for Application up to 10 GHz", IEEE Journal of Solid-State Circuits, vol. SC-18, No. 3, Jun. 1983, pp. 369-376.

Primary Examiner—John S. Heyman
Assistant Examiner—D. R. Hudspeth
Attorney, Agent, or Firm—Richard M. Sharkansky; Walter F. Dawson; Peter J. Devlin

[57] ABSTRACT

A shift register comprising a plurality of memory cells serially coupled together along a signal bus. Each one of the plurality of memory cells comprises a first amplifier, fed by an input logic signal, for amplifying and inverting the logic state of the input logic signal. A first storage section is included for either enabling storage in the first storage section of an electric charge corresponding to the voltage level of the amplified and inverted input logic signal, or disabling storage in the first storage section of the electric charge, selectively in response to a first control signal. The stored electric charge is converted to an intermediate logic signal having a predetermined voltage level. Each memory cell additionally includes a second amplifier, fed by the intermediate logic signal, for amplifying and inverting the logic state of the intermediate logic signal. A second storage section is included for either enabling storage in the second storage section of an electric charge corresponding to the voltage level of the amplified and inverted intermediate logic signal, or disabling storage in the second storage section of the electric charge, selectively in response to a second control signal, the second control signal being out of phase with respect to the first control signal. The stored electric charge is converted to an output logic signal having a predetermined voltage level.

14 Claims, 1 Drawing Figure

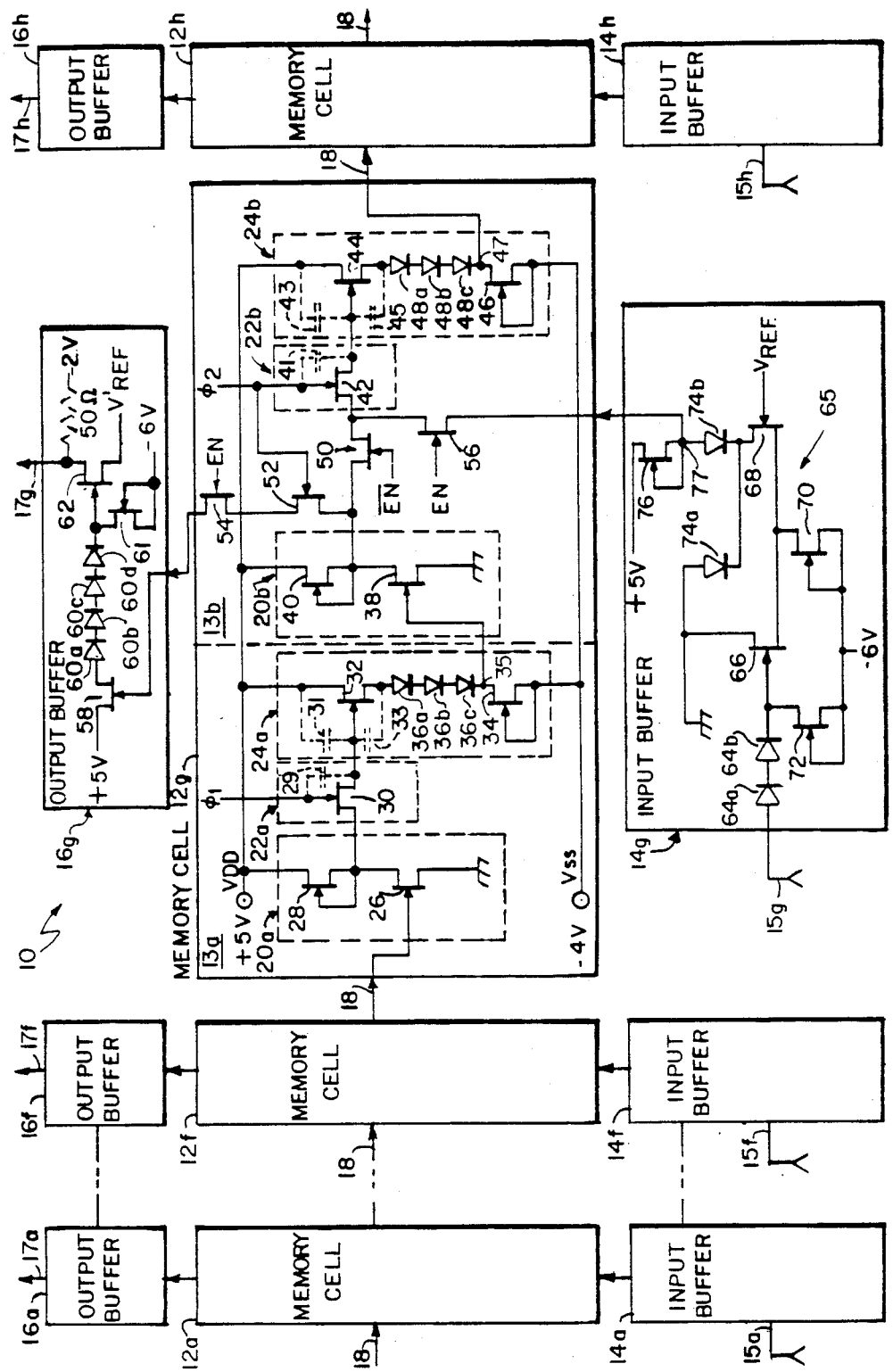

SHIFT REGISTER MEMORY CELL HAVING A TRANSMISSION GATE DISPOSED BETWEEN AN INVERTER AND A LEVEL SHIFTER

BACKGROUND OF THE INVENTION

This invention relates generally to memory cells and more particularly to memory cells for use in digital shift registers.

A digital shift register typically comprises several serially coupled memory cells, the number of which corresponds to the bit capability of the shift register. In an article by M. Rocchi and B. Gabillard entitled "GaAs Digital Dynamic IC's for Applications up to 10 GHz", appearing in the IEEE Journal of Solid-State Circuits, Vol. SC-18, No. 3, June, 1983, the memory cells are described as each comprising a pair of serially coupled, inverting storage circuits, with a transmission gate disposed at the input of each storage circuit to control signal flow into that circuit. The transmission gates are fed by complementary clock signals to switch a selected one of the gates between a conducting state, to clock a signal through the transmission gate and into the storage circuit associated therewith, and a nonconducting state, to inhibit a signal from coupling into the associated storage circuit. A pair of such inverting storage circuits is used in each memory cell so that the output signal from the memory cell has the same logic polarity as the input signal fed to the memory cell.

As it is desirable that digital shift registers operate at the highest possible shifting rate, the pair of storage circuits and the transmission gates of the memory cell have been fabricated using metal electrode field-effect-transistors (MESFETs) on gallium arsenide (GaAs) substrate, as described by the above-referenced article. Gallium arsenide is preferred over other substrates, such as silicon, because of its higher carrier mobility, allowing for more rapid data shifting. Each storage circuit comprises a MESFET, connected as an inverter, which stores in the gate-to-drain and gate-to-source capacitances thereof the electric charge corresponding to the level of a signal coupled to the gate electrode at the time such signal is clocked through the transmission gate connected at the input of the storage circuit. The inverting/charge storing MESFET also produces at the drain electrode thereof an amplified and logically inverted signal from the signal clocked through the transmission gate, coupled to the gate electrode and stored in the capacitances of such MESFET. The storage circuit also includes a level shifter, coupled to the drain electrode of the inverting/charge storing MESFET, which comprises a source-follower MESFET, and a series of level-shifting diodes. The level shifter converts the level of the amplified and inverted signal made available at the drain electrode of the inverting/charge storing MESFET to a level suitable for driving the next storage circuit of the memory cell.

The memory cells' transmission gates are also MESFETs. The gate electrodes of the transmission gates connected at the inputs of the pair of storage circuits of each memory cell are fed by a pair of complementary clock signals. The use of complementary clocks prevents data entering the memory cell from coupling through the pair of storage circuits and exiting the memory cell within the duration of a single clock pulse. Thus, the shifting of data through a memory cell is a two-step process: (1) the first clock signal is applied to the gate electrode of the transmission gate MESFET connected at the input of the first one of the pair of storage circuits, switching the transmission gate to a conducting state to couple a signal into the first storage circuit, where the signal is stored, amplified, inverted and level-shifted; and, (2) the second, complementary clock signal is applied to the gate electrode of the transmission gate MESFET connected at the input of the second one of the pair of storage circuits, switching the transmission gate to a conducting state to couple the level-shifted output of the first storage circuit into the second one of the pair of storage circuits, where the signal is stored, amplified, inverted and level-shifted. The level shifted output of the second storage circuit is the output data signal of the memory cell, shifted in time from the input data signal by the complementary first and second clock signals.

While the above-described memory cell operates at sufficient shifting rates in some applications, it is desirable in many other applications to design a memory cell capable of even higher shifting rates to enable shift registers incorporating such memory cells to operate at the maximum possible data shift rates.

SUMMARY OF THE INVENTION

In accordance with the present invention, a memory cell is provided comprising a pair of serially cascaded circuits. Each one of the pair of circuits comprises means, fed by an input signal, for amplifying the input signal. Each circuit further comprises storage means for either enabling storage in said storage means of an electric charge corresponding to the level of the amplified input signal, or disabling storage in said storage means of such electric charge, selectively in accordance with a control signal fed to the storage means. The storage means further comprises means for shifting the level of a voltage corresponding to the stored electric charge, wherein the level-shifted voltage of the storage means of the first one of the pair of serially cascaded circuits is fed as the input signal to the second one of the pair of serially cascaded circuits. The memory cell additionally includes means for coupling a pair of non-time-coincident control signals to the storage means of the pair of serially cascaded circuits. Preferably, the pair of control signals is complementary.

In a preferred embodiment of the present invention, the memory cell comprises means, including a first transistor having a control electrode fed by a logic signal, for producing an amplification of the logic signal at an output electrode of the first transistor. Also included is a second transistor. Means are further included for producing a predetermined potential difference between an output electrode of the second transistor and an output terminal. Also provided are means, including a third transistor having: a control electrode fed by a control signal; an input electrode coupled to the output electrode of the first transistor; and, an output electrode coupled to a control electrode of the second transistor, for biasing the third transistor, selectively in response to a control signal, between: (i) a conducting state, to electrically couple the output electrode of the first transistor to the control electrode of the second transistor and feed the amplified logic signal to the control electrode of the second transistor; and, (ii) a nonconducting state, to electrically decouple the control electrode of the second transistor from the output electrode of the first transistor. The first, second and third transistors are preferably metal electrode fieldeffect-transistors (MESFETs). With such arrangement, the second MESFET is connected as a noninverting device with the control electrode being the transistor's gate electrode and the output electrode being the source electrode of such transistor. Thus, the second MESFET is connected as a source follower. Such transistor stores in internal gate-to-source and gate-to-drain capacitances an electric charge corresponding to the voltage level of the amplified logic signal fed thereto through the third MESFET in response to the control signal. Since the second MESFET is noninverting, the increase in the gate-to-drain capacitance thereof due to the high-frequency Miller effect does not degrade the level of the amplified logic signal applied to the gate electrode of the second MESFET. To the contrary, the noninverted output at the source electrode thereof enhances (i.e. bootstraps) the amplified logic signal applied to the gate electrode due to the gate-to-source capacitance of the second MESFET. Thus, the memory cell of the present invention may be operated at higher shifting rates than memory cells of the prior art.

A structural embodiment of the present invention comprises a first MESFET having a gate electrode fed by an input signal, a source electrode, and a drain electrode. A second MESFET having a gate electrode, a source electrode coupled to an output terminal, and a drain electrode, is also provided. Further included is a third MESFET having a gate electrode, a source electrode, and a drain electrode, wherein one of the source and drain electrodes of the third MESFET is coupled to the drain electrode of the first MESFET and the other one of the source and drain electrodes of the third MESFET is coupled to the gate electrode of the second MESFET.

A shift register embodying the memory cell of the present invention comprises a plurality of memory cells serially coupled together along a signal bus. Each one of the memory cells comprises means, fed by an input logic signal from the signal bus, for amplifying the input logic signal and inverting the logic state thereof. First storage means is included for either enabling storage in the first storage means of an electric charge corresponding to the voltage level of the amplified and inverted input logic signal, or disabling storage in said first storage means of such electric charge, selectively in response to a first control signal. The electric charge stored in the first storage means is converted to an intermediate logic signal having a predetermined voltage level. Means, fed by the intermediate logic signal, are further provided for amplifying the intermediate logic signal and inverting the logic state thereof. Second storage means either enables storage in said second storage means of an electric charge corresponding to the voltage level of the amplified, and inverted intermediate logic signal, or disables storage in said second storage means of such electric charge, selectively in response to a second control signal. The electric charge stored in the second storage means is converted to an output logic signal having a predetermined voltage level. In the preferred embodiment, the first and second control signals are non-time-coincident, and are preferably complementary, in order to prevent a logic signal from coupling through a memory cell in response to a single one of the first and second control signals.

The present invention further provides a method of shifting an input logic signal through a memory cell, comprising the steps of: amplifying the input logic signal and inverting the logic state thereof; storing the amplified and inverted input logic signal; and, converting the amplified, inverted and stored input logic signal to an intermediate logic signal having a predetermined level. The method further comprises the steps of: amplifying the intermediate logic signal and inverting the logic state thereof; storing the amplified and inverted intermediate logic signal; and, converting the amplified, inverted and stored intermediate logic signal to an output logic signal having a predetermined level.

BRIEF DESCRIPTION OF THE DRAWING

The foregoing features of the present invention and the advantages thereof may be more fully understood by reference to the following detailed specification read in conjunction with the FIGURE, which depicts a schematic diagram of the improved memory cell of the present invention embodied in a digital shift register.

DESCRIPTION OF THE PREFERRED EMBODIMENT

Referring now to the FIGURE, a digital shift register 10 embodying the improved memory cell of the present invention is shown. Digital shift register 10 is shown to comprise a plurality, here eight, of memory cells 12a–12h serially coupled together along serial data bus 18. Memory cells 12a–12h are also fed by parallel ECL (emitter-coupled logic) data bus 15a–15h through a set of input buffers 14a–14h. Memory cells 12a–12h are also coupled to parallel ECL data bus 17a–17h through a set of output buffers 16a–16h, as shown.

Memory cell 12g depicts the detailed circuitry of memory cells 12a–12h. Memory cell 12g is shown to comprise a pair of serially cascaded, inverting storage circuits 13a, 13b. A pair of such inverting circuits is used to ensure that data undergoes no net logic inversion when shifted through memory cell 12g. First inverting storage circuit 13a comprises first inverting amplifier section 20a having an input fed by serial data bus 18 and an output coupled to first storage/level converter section 24a through first transmission gate 22a. Likewise, second inverting storage circuit 13b comprises second inverting amplifier section 20b having an input fed by the output of first storage/level converter section 24a. The output of second inverting amplifier section 20b is coupled through second transmission gate 22b to second storage/level converter section 24b. It is noted here that improved memory cell 12g has the pair of storage circuits 13a, 13b connected directly together, with a transmission gate disposed inside of each storage circuit between an inverting amplifier section and a storage/level converter section. This is contrasted with the memory cell of the referenced article in which a transmission gate is disposed between each pair of storage circuits—with the inverting amplifier section of each storage circuit serving also as a storage section and feeding directly a non-storage level converter section.

Memory cells 12a–12h, input buffers 14a–14h and output buffers 16a–16h comprise in the preferred embodiment a monolithic integrated circuit of MESFETs (metal semiconductor field effect transistors) and diodes fabricated on gallium arsenide (GaAs) substrate to enable digital shift register 10 to operate at the highest possible shift rate while using little power. The MESFETs used are here n-channel, depletion-mode transistors, although it is understood other types of MESFETs may be used.

First inverting amplifier section 20a comprises MESFET 26 having a gate electrode fed by serial data bus 18 and a source electrode coupled to a reference potential (here ground potential). Also included is MESFET 28 having the gate and source electrodes thereof coupled together and to the drain electrode of MESFET 26. A reference voltage $V_{DD}$ of, here, +5 volts DC is fed to the drain electrode of MESFET 28. Thus it is seen that MESFET 28 is connected to bias MESFET 26 with a constant current. The drain electrode of MESFET 26 serves as the output of first amplifier section 20a; hence, such transistor is connected as an inverter. The drain electrode of MESFET 26 is coupled to the drain electrode of MESFET 30 in first transmission gate 22a. The gate electrode of MESFET 30 is fed by clock signal $\phi_1$, generated by a conventional clock generator (not shown). The source electrode of MESFET 30 is coupled to the gate electrode of MESFET 32 in first storage/level converter section 24a. Transmission gate MESFET 30 is thus connected as a series switch to control data signal flow from first amplifier section 20a to first storage/level converter section 24a in accordance with clock signal $\phi_1$, as will be described in detail hereinafter. Suffice it here to say that clock signal $\phi_1$ selectively biases MESFET 30 between: full conductance from drain to source, to electrically couple the source electrode of MESFET 26 to the gate electrode to MESFET 32 and feed a data signal to first storage/level converter section 24a; and, pinch-off (i.e. a nonconducting state), to electrically decouple the gate electrode of MESFET 32 from the drain electrode of MESFET 26 and inhibit a data signal from coupling to first storage/level converter section 24a. Reference voltage $V_{DD}$ is coupled to the drain electrode of MESFET 32. The source electrode of MESFET 32 is coupled through a plurality, here three, of diodes (i.e. P-N junctions) 36a, 36b, 36c to the drain electrode of MESFET 34. The gate and source electrodes of MESFET 34 are tied together and coupled to reference potential $V_{SS}$, here $-4$ volts D.C. MESFET 34 thus serves to provide a constant current for MESFET 32 and diodes 36a, 36b, 36c. The junction of the cathode of diode 36c and the drain electrode of MESFET 34 is the output terminal 35 of first inverting storage circuit 13a and is coupled to second amplifier section 20b of second storage circuit 13b. Thus, it is seen that MESFET 32 is connected as a noninverting source-follower. Diodes 36a, 36b, 36c produce a predetermined potential difference between the source electrode of MESFET 32 and output terminal 35 and are used to convert (i.e., shift) the level of a data signal at the source electrode of MESFET 32 to a predetermined level suitable to be fed to second storage circuit 13b.

Second inverting amplifier section 20b is configured identically as first inverting amplifier section 20a and contains two MESFETs 38, 40 connected as shown. The gate electrode of MESFET 38 is coupled to output terminal 35 of first inverting storage circuit 13a. The source electrode of MESFET 38 is coupled to a reference potential (here ground) and the drain electrode thereof is coupled to the source and gate electrodes of MESFET 40. The drain electrode of MESFET 40 is fed by reference potential $V_{DD}$ (+5 VDC) and thus such transistor supplies a constant current to MESFET 38. The output of second amplifier section 20b is taken from the drain electrode of transistor 38; thus, such MESFET is connected as an inverter. The drain electrode of MESFET 38 is coupled to the drain electrode of MESFET 42 in second transmission gate 22b via the drain and source electrodes of control gate 50; the purpose of control gate 50 will be described hereinafter. The source electrode of MESFET 42 is coupled to the gate electrode of MESFET 44 in second storage/level converter section 24b. Transmision gate MESFET 42 is connected as a series switch to control data signal flow into second storage/level converter section 24b, in a manner similar to that of transmission gate MESFET 30. Second transmission gate 22b is controlled by clock signal $\phi_2$, fed to the gate electrode of MESFET 42. Clock signal $\phi_2$ is generated by a conventional clock generator (not shown) and is non-overlapping (i.e. non-time-coincident) with clock signal $\phi_1$, in order to ensure that the shifting of data through memory cell 12g requires the sequential occurrence of clock signal $\phi_1$ followed by clock signal $\phi_2$. In the preferred embodiment clock signals $\phi_1$ and $\phi_2$ are complementary pulse trains and thus occur as a pair of signals applied seriatim to shift data, first, into first storage circuit 13a and, second, into second storage circuit 13b. MESFET 44 in second storage/level converter section 24b is connected as a source follower, and is thus noninverting. The source electrode of MESFET 44 is coupled through a plurality, here three, of diodes (i.e. P-N junctions) 48a, 48b, 48c to output terminal 47 of second inverting storage circuit 13b. Output terminal 47 is coupled to serial data bus 18. Reference potential $V_{DD}$(+5 VDC) is fed to the drain electrode of MESFET 44. MESFET 46, having its gate and source electrodes coupled together and to reference potential $V_{SS}$ ($-4$ VDC), and its drain electrode coupled to the cathode of diode 48c and output terminal 47, provides a constant current for MESFET 44 and diodes 48a, 48b, 48c.

In the shift register 10 of the preferred embodiment, memory cell 12g is coupled to line 15g of parallel ECL data bus 15a–15h through conventional input buffer 14g, and to line 17g of parallel ECL data bus 17a–17h through conventional output buffer 16g. Input buffer 14g functions as an ECL level converter and includes a conventional MESFET differential amplifier 65 comprising MESFETs 66, 68 and current source MESFET 70, connected as shown. Data at ECL levels (i.e., approximately $-0.955$ volts for a logic "1" and $-1.705$ volts for a logic "0") is fed to the gate of MESFET 66 through level shifting diodes 64a, 64b. A reference voltage $V_{REF}$ of here, $-3.5$ volts is coupled to the gate electrode of MESFET 68 for purposes to be discussed. MESFETS 70, 76 connected as shown provide constant current for MESFETs 66, 68, while MESFET 72 supplies constant current for diodes 64a, 64b. Diodes 74a, 74b are included and connected as shown to keep the voltage at output node 77 of input buffer 14g from dropping below a predetermined level, as will be discussed.

Output node 77 is coupled to the drain electrode of control gate MESFET 56 in memory cell 12g. The source electrode of MESFET 56 is coupled to the drain electrode of transmission gate MESFET 42 and to source electrode of control gate MESFET 50 as shown. The gate electrode of MESFET 56 is fed by control signal EN, the complement $\overline{EN}$ of which is fed to the gate electrode of control gate MESFET 50 for purposes to be discussed.

Conventional output buffer 16g functions as an ECL level converter and comprises source-follower MESFET 58, the source electrode of which is coupled through a plurality, here four, of level shifting diodes 60a, 60b, 60c, 60d to the gate electrode of MESFET 62. The drain electrode of MESFET 58 is fed by a reference voltage of, here, +5 VDC. MESFET 61, connected as shown, supplies diodes 60a–60d and MESFET 58 with a constant current from a reference potential of, here, −6 VDC. Reference potential V'$_{REF}$(here, about −0.7 volts D.C.) is applied to the drain electrode of MESFET 62 for purposes to be discussed. The source electrode of MESFET 62 is coupled to line 17g of parallel ECL data bus 17a–17h. At a destination (not shown) of data bus 17a–17h the parallel lines thereof are coupled to an external voltage of, here, −2 VDC through a resistance of, here 50 ohms in order to nominally place an ECL level logic "0" (i.e., approximately −1.705 volts) on each line 17a–17h of the parallel data bus. The 50 ohm resistor is shown in phantom in the FIGURE to emphasize that such resistor is not physically located in output buffer 16g.

Data is applied to the gate electrode of MESFET 58 from the output of second inverting amplifier section 20b in memory cell 12g. The drain electrode of MESFET 38 is coupled to the drain electrode of transmission gate MESFET 52, the gate electrode of which is fed by clock signal $\phi_2$ for purposes to be described hereinafter. The source electrode of MESFET 52 is coupled to the drain electrode of control gate MESFET 54, the source electrode of which is coupled to the gate electrode of MESFET 58 in output buffer 16g. Control signal EN is fed to the gate electrode of MESFET 54.

In operation, the normal function of shift register 10 is to serially shift data therethrough from memory cell 12a to memory cell 12h along serial data bus 18. The serial shifting of data through each memory cell (e.g., memory cell 12g) is a two step process, controlled by clock signals $\phi_1$, $\phi_2$, which here are complementary pulse trains and thus occur sequentially. A pair of clock signals $\phi_1$, $\phi_2$ must occur to serially shift data through memory cell 12g. Data is serially shifted into and stored in first storage circuit 13a upon the occurrence of clock signal $\phi_1$. Immediately thereafter, clock signal $\phi_2$ occurs, shifting the data stored in first storage circuit 13a into second storage circuit 13b for storage. Such stored data also appears on serial data bus 18 as the serial data output of memory cell 12g.

Data entering first storage circuit 13a on serial data bus 18 is applied to the gate electrode of MESFET 26. The voltage range of the data on serial data bus 18 here is between about +0.4 volts (representing a logic "1") and about −2.6 volts (representing a logic "0"). MESFETs 26, 28 here have a pinch-off voltage of −2.25 volts. Thus, when a signal level of −2.6 volts (a logic "0") is applied to the gate electrode of MESFET 26, the transistor is pinched-off and conducts no current from drain to source. The voltage at the drain electrode thereof is thus essentially V$_{DD}$, or +5 volts—a conventional buffered-FET-logic (BFL) "1". Conversely, when a signal level of +0.4 volts (a logic "1") is fed to the gate of MESFET 26, the device fully conducts current from drain-to-source, placing about +0.5 V—a conventional BFL "0"—at the drain electrode. Thus it is seen that first inverting amplifier section 20a inverts the logic polarity of a signal applied thereto and provides gain to such signal. Such amplification is desirable in shift registers with several cascaded memory elements, as the data signal would otherwise lose strength by propagating through the several transmission gates and storage sections of the shift register.

The amplified and inverted data signal output of first amplifier section 20a is applied to first storage/level converter section 24a via transmission gate 22a only during the occurrence of clock signal $\phi_1$. Clock signal $\phi_1$ here is a pulse train having a nominal level of −4.5 volts, such level switching to +0.5 volts when clock $\phi_1$ occurs. Clock signal $\phi_1$ is applied to the gate electrode of transistor 30, a MESFET having a −5 volt pinch-off voltage. Thus, when clock signal $\phi_1$ is at its nominal level, transmission gate MESFET 30 is pinched-off for either BFL data level, (+5 V or +0.5 V) applied to the drain electrode thereof from first amplifier section 20a. A high impedance thus exists between the drain and source electrodes of MESFET 30, preventing the amplified and inverted BFL-level data signal from being applied to first storage/level converter section 24a. Conversely, when clock signal $\phi_1$ occurs, applying +0.5 volts to the gate of MESFET 30, the transistor switches to a fully conductive state between drain and source, allowing the amplified and inverted BFL-level data signal output of first amplifier section 20a to be coupled to the gate electrode of source-follower MESFET 32 in first storage/level converter section 24a. The resultant flow of current through MESFET 30 into MESFET 32 charges the inherent gate-to-drain capacitance ($C_{gd}$) 31 and gate-to-source capacitance ($C_{gs}$) 33 of MESFET 32, as well as the gate-to-source capacitance ($C_{gs}$) 29 of transmission gate MESFET 30, with an aggregate electric charge corresponding to the voltage level of the BFL data signal coupled to the gate electrode of MESFET 32 in response to clock signal $\phi_1$. Capacitances 29, 31, 33 are shown in phantom in the FIGURE to emphasize that such capacitances are inherent in MESFETs 30, 32, respectively, and are not discrete circuit components. When clock signal $\phi_1$ returns to its nominal −4.5 V level, MESFET 30 pinches-off, and a high impedance again exists between the drain and source electrodes thereof, preventing the charge stored in capacitances 29, 31, 33 from discharging through transmission gate MESFET 30. The level of charge stored in inherent capacitances 29, 31, 33 is thus maintained for a finite period of time, here until clock $\phi_1$ again occurs to apply another data signal to MESFET 32 for storage. Thus it is seen that transmission gate MESFET 30 either enables storage in capacitances 29, 31, 33 of an electric charge corresponding to the voltage level of the amplified and inverted data signal output of first amplifier section 20a, or disables storage in such capacitances 29, 31, 33 of such electric charge, selectively in accordance with clock signal $\phi_1$.

MESFET 32 here has a −2.25 volt pinch-off voltage and is connected as a source-follower, with the data signal produced at the source electrode thereof being the same polarity as, though slightly reduced in amplitude from, the BFL-level data signal applied to the gate electrode thereof in response to clock signal $\phi_1$. Thus, the data signal present at the source electrode of MESFET 30 is either about +5 volts (for a BFL "0" applied to memory cell 12g) or about +0.5 volts (when a BFL "1" is fed to memory cell 12g). Such data signal is applied to second storage circuit 13b through a series, here three, of level-shifting diodes 36a, 36b, 36c, each with a voltage drop of about 1.1 volts. Level shifting diodes 36a, 36b, 36c convert a +5 volt data signal at the source electrode of MESFET 32 to about +0.4 volts at the gate electrode of MESFET 38 in second inverting amplifier section 20b. Level shifting diodes 36a, 36b, 36c, along with V$_{SS}$ (−4 VDC), place about −2.6 V at the gate electrode of MESFET 38 when a +0.5 volt data signal is present at the source electrode of source-follower MESFET 32. Thus it is seen that level shifting diodes 36a, 36b, 36c provide a level shifted output signal from first inverting storage circuit 13a having substantially the same voltage range as the input data signal fed to first inverting storage circuit 13a from serial data bus 18. Such level conversion is necessary to ensure that a data signal is applied to MESFET 38 which switches such transistor between a fully conducting state and a pinched-off state.

The operation of second storage circuit 13b is similar to that of first storage circuit 13a. However, second storage circuit 13b includes circuitry not found in first storage circuit 13a (i.e., control gates 50, 54, 56 and transmission gate 52) to control the flow of parallel data into and out of second storage circuit 13b, as will be discussed in detail hereinafter. Second inverting amplifier section 20b provides a BFL level output of +0.5 volts (logic "0") when +0.4 volts is applied to the gate electrode of MESFET 38. Such transistor has a −2.25 volt pinch-off voltage and thus provides a +5 volt output (a BFL logic "1") when −2.6 volts is fed to the gate thereof. Thus it is seen that second inverting amplifier section 20b both amplifies and inverts the data signal applied thereto. It is further seen that the logic polarity of the data signal produced at the drain electrode of MESFET 38 is the same as the logic polarity of the data signal originally applied to memory cell 12g on serial data bus 18, due to the double inversion of first and second inverting amplifier sections 20a, 20b. During serial shifting, the output of second inverting amplifier section 20b is coupled through control gate 50 and, upon the occurrence of clock signal $\phi_2$, through transmission gate 22b to second storage/level converter section 24b. The function of control gate 50, as well as that of control gates 54, 56, will be discussed in detail hereinafter. Suffice it here to say that during the time that data is being serially shifted through memory cells 12a–12h along serial data bus 18, control gate 50 is biased to a fully conducting state by control signal $\overline{EN}$ to permit free data signal flow from the drain to source electrodes thereof, and control gates 54, 56 are pinched-off (and thus nonconducting) in response to complementary control signal EN to prohibit the data signal from flowing through either transistor.

Transistor 42 of transmission gate 22b is fed by clock signal $\phi_2$, here a pulse train having a nominal level of −4.5 volts and switching to +0.4 volts when clock signal $\phi_2$ occurs. The clock $\phi_2$ pulse train here is the complement of the clock $\phi_1$ pulse train. When clock signal $\phi_2$ is at its nominal −4.5 V level, MESFET 42 is pinched-off and thus prevents the data signal from coupling to second storage/level converter section 24b. When clock signal $\phi_2$ occurs, switching to a level of +0.4 volts, MESFET 42 fully conducts, coupling the data signal to the gate electrode of MESFET 44 and charging inherent capacitances 43 ($C_{gd}$) and 45 ($C_{gs}$) thereof, as well as inherent capacitance 41 ($C_{gs}$) of MESFET 42, with an aggregate electric charge corresponding to the BFL signal level (+0.5 or +5 volts) of the data signal coupled to the gate eleccrode of MESFET 44 in response to clock signal $\phi_2$. Capacitances 41, 43, 45 are shown in phantom in the FIGURE to stress that they are inherent characteristics of MESFETs 42, 44, respectively, rather than discrete circuit elements. When clock signal $\phi_2$ returns to its nominal level, pinching off MESFET 42, a high impedance is presented to capacitances 41, 43, 45 preventing the electric charge stored therein from discharging through transmission gate MESFET 42. Thus, the electric charge is stored in inherent capacitances 41, 43, 45 for a finite period of time, here until clock signal $\phi_2$ again occurs to apply another data signal to MESFET 44 for storage. Thus it is seen that transmission gate MESFET 42 either enables storage in capacitances 41, 43, 45 of an electric charge corresponding to the voltage level of the amplified and inverted data signal output of second amplifier section 20b, or disables storage in such capacitances 41, 43, 45 of such electric charge, selectively in accordance with clock signal $\phi_2$.

Since MESFET 44 is connected as a source-follower, the transistor produces a signal at the source electrode thereof which follows in polarity and approximately in amplitude the signal fed to the gate electrode thereof in response to clock signal $\phi_2$. Thus, +5 volts is produced at the source electrode of MESFET 44 in response to a data signal level of +5 volts fed to the gate electrode thereof, and +0.5 volts is produced at the source electrode of MESFET 44 in response to a +0.5 volt data signal fed to the gate electrode thereof. The data signal is coupled through level-shifting diodes 48a, 48b, 48c to serial data bus 18 for application to memory cell 12h. As is the case with first storage/level converter circuit 24a, level-shifting diodes 48a, 48b, 48c convert a +5 volt data signal (a BFL "1") to a signal on serial data bus 18 of about +0.4 volts (a logic "1"). A +0.5 volt data signal (a BFL "0") is converted by diodes 48a, 48b, 48c to a level of −2.6 volts (a logic "0") on serial data bus 18. Thus it is seen that level shifting diodes 48a, 48b, 48c provide a level shifted output signal from second inverting storage circuit 13b having substantially the same voltage range as the data signal fed to second inverting storage circuit 13b from first inverting storage circuit 13a. Such level conversion is necessary to enable the data signal fed on serial data bus 18 to memory cell 12h to switch the first inverting amplifier section thereof between a fully conducting state and pinch-off. A little thought thus reveals that a data signal applied to memory cell 12g on serial data bus 18 is serially shifted through memory cell 12g by a sequential occurrence of clock signals $\phi_1$ and $\phi_2$ with no net inversion of the signal's logic polarity.

It is noted that the improved memory cell of the present invention obtains functional advantages over memory cells of the prior art, which store the data signal in the inherent gate-to-drain and gate-to-source capacitances of an inverting/charge storage MESFET. At high operating frequencies, the Miller effect increases the gate-to-drain capacitance of the inverting/charge storing MESFET, providing a lower impedance signal path between the gate and drain electrodes of such transistor. This causes a portion of the inverted signal at the drain electrode of the inverting/charge storage MESFET to couple to the gate electrode thereof. Since the signal at the drain electrode of the inverting/charge storage MESFET is amplified and inverted with respect to the signal stored at the gate electrode thereof, the level of the signal stored at the gate electrode may be degraded by such coupling between the drain and gate electrodes. For example, a logic "1" fed to the gate electrode of the inverting/charge storage MESFET will appear as a logic "0" at the drain electrode thereof. At high operating speeds, a portion of the logic "0" at the drain electrode will be coupled to the gate electrode due to the Miller effect, degrading the logic "1" level at the gate electrode. Thus, the Miller effect may limit the maximum operating speed of such prior art memory cell. However, the memory cell of the present invention, by storing the data signal in the inherent gate-to-drain and gate-to-source capacitances of non-inverting, source-follower MESFETs 32, 44, eliminates the problem of the Miller effect at high operating frequencies. Since MESFETs 32, 44 are noninverting, the Miller effect enhancement of gate-to-drain capacitances 31, 43, repectively, of the transistors does not degrade the level of the data signal applied to the gate electrodes of MESFETs 32, 44. To the contrary, the noninverted data output signals at the source electrodes of MESFETs 32, 44 provide a "bootstrapping" effect to enhance the data signals applied to each gate electrode. Thus, the improved memory cell of the present invention may be operated at higher frequencies than memory cells of the prior art, since the stored data signals are not adversely affected by the high-frequency Miller effect.

It is noted that digital shift register 10 has several alternate modes of operation. In a first such alternate mode, shift register 10 functions as a serial-in/parallel-out device in which eight bits of data are serially shifted into shift register 10 along serial data bus 18 and stored in memory cells 12a-12h, respectively, by eight sequential occurrences of clock signals $\phi_1$, $\phi_2$. Upon application of control signal EN the eight bits of data are coupled in parallel out of shift register 10 onto data bus 17a-17h as a data "word". In a second alternate mode of operation, shift register 10 functions as a parallel-in/serial-out device in which an eight bit data word on parallel data bus 15a-15h is loaded into memory cells 12a-12h, one bit in each memory cell, upon the occurrence of control signal EN. The eight bits of data are then serially shifted out of shift register 10 along serial data bus 18, by seven sequential occurrences of clock signals $\phi_1$, $\phi_2$. Control gates 50, 54 and 56, as well as transmission gate 52, in memory cells 12a-12h control such alternate modes of operation. Control gates 50, 54, 56 and transmission gate 52 are all n-channel, depletion-mode MESFETs having a $-5$ volt pinch-off voltage. The gate electrodes of control gate MESFETs 54, 56 are fed by control signal EN. Control signal $\overline{EN}$ is coupled to the gate electrode of control gate MESFET 50. Control signals EN, $\overline{EN}$ are complementary, as discussed, the level of each alternating between $+0.4$ volts and $-4.5$ volts, and are used to selectively switch control gate MESFETs 50, 54, 56 between full conductance and pinch-off (i.e., nonconducting), respectively.

During the serial-in/parallel-out operating mode, control signal $\overline{EN}$ is maintained at $+0.4$ volts, and control signal EN held at $-4.5$ volts, during seven sequential occurrences of clock signals $\phi_1$ and $\phi_2$ and an eighth occurrence of clock signal $\phi_1$. During the eighth occurrence of clock signal $\phi_2$, the levels of control signals EN and $\overline{EN}$ are reversed; that is, EN applies $+0.4$ volts to the gate electrodes of MESFETs 54, 56, and $\overline{EN}$ applies $-4.5$ volts to the gate electrode of MESFET 50. Thus, during the first seven sequential occurrences of clock signals $\phi_1$, $\phi_2$ and the eighth occurrence of clock $\phi_1$, control gate MESFET 50 is fully conducting while control gate MESFETs 54, 56 are pinched-off. During such time data is serially shifted into shift register 10 along serial data bus 18 from memory cell 12a to memory cell 12h in the manner previously discussed. A little thought reveals that immediately prior to the eighth occurrence of clock signal $\phi_2$, eight bits of serial data are stored in the first storage circuits 13a of memory cells 12a-12h, respectively. When the eighth clock signal $\phi_2$ occurs, and the levels of control signals EN, $\overline{EN}$ are reversed, the data bit stored in first storage circuit 13a of each memory cell 12a-12h is coupled through fully conducting transmission gate MESFET 52 and fully conducting control gate MESFET 54 to parallel data bus 17a-17h, and is inhibited from coupling to second storage/level converter section 24b by pinched-off control gate MESFET 50. In the preferred embodiment, parallel data bus 17a-17h is coupled to an ECL (emitter-coupled-logic) memory device (not shown) which stores the parallel data as an eight-bit, ECL-level "word". As has been discussed, the data signal present at the output of second inverting amplifier section 20b is at BFL levels of either $+5$ volts (logic "1") or $+0.5$ volts (logic "0"). As is known, ECL logic levels are about $-0.955$ volts (logic "1") and $-1.705$ volts (logic "0"). Thus, shift register 10 includes output buffers 16a-16h to convert the BFL level voltages used by memory cells 12a-12h to ECL compatible signal levels.

Each output buffer 16a-16h couples the data signal fed thereto through source-follower MESFET 58 and level-shifting diodes 60a, 60b, 60c, 60d to MESFET 62. Such diodes have a voltage drop of about 1.1 volts and translate the BFL voltage level of the data signal fed to MESFET 58 to a voltage which will selectively switch MESFET 62 to pinch-off or to full conductance, depending on the logic state of the BFL data signal. For example, a BFL data signal of $+5$ volts (logic "1") fed to source follower MESFET 58 of output buffer 16g is reduced to a level of about $+0.6$ volts at the gate electrode of MESFET 62. Such level is sufficient to place MESFET 62 in a fully conducting state. Thus, reference potential V'$_{REF}$($-0.7$ VDC) at the drain electrode thereof is coupled to the source electrode of MESFET 62, placing an ECL-level logic "1" (about $-0.955$ volts) on line 17g of parallel data bus 17a-17h. On the other hand, level-shifting diodes 60a-60d translate a BFL "0" ($+0.5$ volts) fed to MESFET 58 to about $-3.9$ volts at the gate of MESFET 62. The pinch-off voltage of MESFET 62 is $-2.25$ volts, thus the transistor is pinched-off, preventing V'$_{REF}$ from being coupled to the source electrode of MESFET 62. Thus, line 17g of parallel data bus 17a-17h becomes an ECL "0" (about $-1.705$ volts) due to the fact that such line is "pulled down" to $-2$ volts by a 50 ohm resistor, as previously discussed.

It is noted here that output buffers 16a-16h additionally are storage devices. That is, the data signal fed to source follower MESFET 58 charges the inherent gate-to-drain and gate-to-source capacitances (not shown) of MESFET 58 and the inherent gate-to-source capacitance (not shown) of MESFET 54. When control signal EN pinches-off MESFET 54, a high-impedance is presented to such charged inherent capacitances which allows such capacitances to remain charged for a finite amount of time, here until control signal EN next switches control gate MESFET 54 to full conductance to place another eight bit parallel word on data bus 17a-17h from memory cells 12a-12h.

During the parallel-in/serial-out operating mode, an eight bit data word is loaded in parallel from data bus 15a-15h into second storage circuits 13b of memory cells 12a-12h, respectively. The eight bits of data are then serially shifted out of shift register 10 along serial data bus 18 by seven sequential occurrences of clock signals $\phi_1$, $\phi_2$. In the preferred embodiment, data bus 15a-15h is fed by the output of an ECL memory device (not shown); hence, the ECL-level data is coupled through input buffers 14a-14h before being applied to memory cells 12a-12h in order to translate the ECL data levels to BFL voltages suitable for use by memory cells 12a-12h. For example, a data signal of about −0.955 volts (an ECL "1") entering input buffer 14g on line 15g is fed through level-shifting diodes 64a, 64b, each having about a 1.1 volt drop, to the gate of differential amplifier MESFET 66 of conventional differential amplifier 65, thus placing a potential of about −3.1 volts at such gate electrode. Since the gate electrode of MESFET 66 is at a higher potential than the gate electrode of MESFET 68 (fed by $V_{REF} = -3.5$ volts), MESFET 68 is nonconducting, and about +5 volts (a BFL level "1") appears at output node 77. On the other hand, a data signal of about −1.705 volts (an ECL "0") entering input buffer 14g is level shifted to about −3.9 volts at the gate of MESFET 66 by diodes 64a, 64b. Since this voltage is lower than the −3.5 volt reference voltage fed to the gate of MESFET 68, such transistor fully conducts current, producing about a +0.5 volt signal (a BFL level "0") at output node 77. It is noted that diodes 74a, 74b are arranged to prevent node 77 from going below 0 volts and thus drawing current from control signal EN through control gate 56.

In the parallel-in/serial-out operating mode, the parallel data output of input buffers 14a-14h is loaded as an eight-bit "word" into memory cells 12a-12h, and is stored in second storage circuits 13b of such memory cells, upon the simultaneous occurrence of control signal EN and clock signal $\phi_2$. That is, during a predetermined occurrence of clock signal $\phi_2$ control signal EN is switched to +0.5 volts (and thus control signal $\overline{EN}$ switched to −4.5 volts). Control gate MESFET 56 thus fully conducts current from drain to source—allowing the applied BFL-level data signal from input buffer 14g to couple therethrough to second transmission gate 22b. Control gate MESFET 50 is pinched-off by control signal $\overline{EN}$, thus inhibiting data signal flow therethrough. Transmission gate MESFET 42 fully conducts current from drain to source in response to the +0.4 volt signal applied to the gate thereof by the predetermined occurrence of clock $\phi_2$, thus coupling the data signal to source-follower MESFET 44 and charging inherent capacitances 41, 43, 45. When clock signal $\phi_2$ returns to its nominal level of −4.5 volts, MESFET 42 pinches-off, presenting a high-impedance to charged capacitances 41, 43, 45. Such capacitances thus retain their charge, storing the data signal therein. Thus it is seen that the eight bit data word is stored in second storage circuits 13b of memory cells 12a-12h. Upon the return of clock $\phi_2$ to the nominal −4.5 volt level, the state of control signals EN, $\overline{EN}$ are reversed, pinching off control gates 54, 56 and making control gate 50 fully conducting. The eight bits of data are then serially shifted out of shift register 10 along serial data bus 18 by seven sequential occurrences of clock signals $\phi_1$ and $\phi_2$ in the manner previously described.

A little thought reveals that shift register 10 may perform in the serial-in/parallel-out and the parallel-in/serial-out operating modes simultaneously without any loss of data. Complementary clock signals $\phi_1$ and $\phi_2$ run continuously in cycles of eight, with control signal EN occurring during every eighth occurrence of clock signal $\phi_2$. During every cycle, eight bits of data are serially shifted into shift register 10 in the manner previously discussed and fill memory cells 12a-12h. Upon the eighth occurrence of clock signal $\phi_2$, control signal EN occurs and the serially-loaded data stored in first storage circuits 13a of memory cells 12a-12h are coupled onto parallel data bus 17a-17h. Simultaneously, an eight bit data word on data bus 15a-15h is loaded in parallel into memory cells 12a-12h and stored in second storage circuits 13b thereof. During the next cycle, the parallel-loaded data word is serially shifted out of shift register 10 along serial data bus 18 simultaneously as eight new bits of data are serially shifted into shift register 10 and fill memory cells 12a through 12h.

Having described a preferred embodiment of the present invention, various alterations and modifications may become apparent to those of skill in the art. For example, shift register 10 need not be an eight-bit device. Also, shift register 10 need not be used with ECL-level parallel data; other logic levels may be used, requiring other conventional level conversion circuits, or perhaps no level conversion at all. Additionally, clock signals $\phi_1$, $\phi_2$ need not be complementary, but should not overlap (i.e. be time-coincident) for long enough to allow data entering each memory cell to pass therethrough within the duration of a single one of the clock signals. Also, transistors other than MESFETs, for example JFETs, may be used. Further, transistors may be used having pinch-off voltages of other than −2.25 volts and −5 volts. Moreover, level-shifting diodes may be used having other than 1.1 volt drops, requiring adjustment of the number of such diodes serially connected to achieve the desired voltage level shifting. Thus, it is understood that the scope of the present invention is to be limited only by the scope of the appended claims.

What is claimed is:

1. A memory cell comprising:
   (a) a pair of serially cascaded circuits, each one of the pair of circuits comprising:
      (i) means for receiving an input signal and for amplifying the input signal; and
      (ii) storage means for either enabling storage in said storage means of an electric charge corresponding to the level of the amplified input signal or disabling storage in said storage means of such electric charge, selectively in accordance with a control signal coupled to said storage means, said storage means further comprising means for shifting the level of a voltage corresponding to the stored electric charge, wherein the level-shifted voltage of the storage means of the first one of the pair of serially cascaded circuits is coupled as the input signal to the second one of the pair of serially cascaded circuits; and
   (b) means for coupling a pair of non-overlapping control signals to the storage means of the pair of serially cascaded circuits, respectively.

2. The memory cell of claim 1 wherein the input signal coupled to each one of the pair of serially cascaded circuits has a predetermined voltage range, and the level shifting means of the storage means of each one of the pair of serially cascaded circuits is selected to provide a level shifted voltage having substantially the same voltage range as the input signal coupled to each one of the pair of serially cascaded circuits.

3. The memory cell of claim 1 wherein the pair of non-overlapping control signals are complementary signals.

4. In combination:
   means, including a first transistor having control electrode means for receiving a logic signal, for producing an amplfiication of the logic signal at an output electrode of the first transistor;

a second transistor;

means for producing a predetermined potential difference between an output electrode of the second transistor and an output terminal;

means, including a third transistor having: control electrode means for receiving a control signal; an input electrode coupled directly to the output electrode of the first transistor; and, an output electrode coupled to a control electrode of the second transistor, for biasing the third transistor, selectively in response to a control signal, between:

(i) a conducting state, to electrically coupled the output electrode of the first transistor to the control electrode of the second transistor and apply the amplified logic signal to the control electrode of the second transistor; and (ii) a nonconducting state, to electrically decouple the control electrode of the second transistor from the output electrode of the first transistor.

5. The combination of claim 4 wherein the first, second and third transistors are field-effect-transistors.

6. The combination of claim 4 wherein the predetermined potential difference producing means comprises a diode coupled between the output electrode of the second transistor and the output terminal.

7. A shift register comprising a plurality of memory cells serially coupled together along a signal bus, each one of the plurality of memory cells comprising:

means for receiving an input logic signal from the signal bus and for amplifying the input logic signal and inverting the logic level thereof;

first storage means for either enabling storage in said first storage means of an electric charge corresponding to the voltage level of the amplified and inverted input logic signal or disabling storage in said first storage means of such electric charge, selectively in response to a first control signal;

means for converting the electric charge stored in the first storage means to an intermediate logic signal having a predetermined voltage level;

means for receiving the intermediate logic signal and for amplifying the intermediate logic signal and inverting the logic level thereof;

second storage means for either enabling storage in said second storage means of an electric charge corresponding to the voltage level of the amplified and inverted intermediate logic signal or disabling storage in said second storage means of such electric charge, selectively in response to a second control signal;

means for converting the electric charge stored in the second storage means to an output logic signal having a predetermined voltage level; and wherein the first and second control signals are complementary signals.

8. The shift register of claim 7 wherein each one of the plurality of memory cells is coupled to a corresponding one of a set of circuit paths, each one of the plurality of memory cells further comprising:

means, responsive to a third control signal and the second control signal, for selectively coupling the amplified and inverted intermediate logic signal to the one of the set of circuit paths associated with the memory cell, and for inhibiting such signal from coupling to the second storage means.

9. The shift register of claim 7 wherein each one of the plurality of memory cells is coupled to a corresponding one of a set of circuit paths, each one of the plurality of memory cells further comprising:

means, responsive to a third control signal, for selectively coupling a logic signal from one of the set of circuit paths associated with the memory cell to the second storage means, said second storage means either enabling storage in said second storage means of an electric charge corresponding to the voltage level of said logic signal or disabling storage in said second storage means of such electric charge, selectively in response to the second control signal.

10. In combination:

a first MESFET having: gate electrode means for receiving an input signal; and, a drain electrode;

a second MESFET having: a gate electrode; and, a source electrode coupled to an output terminal; and a third MESFET having: gate electrode means for receiving a control signal; a source electrode; and, a drain electrode, wherein one of the source and drain electrodes of the third MESFET is coupled to the drain electrode of the first MESFET and the other one of the source and drain electrodes of the third MESFET is coupled to the gate electrode of the second MESFET.

11. The combination of claim 10 wherein the first MESFET further comprises a source electrode coupled to a first reference potential, and further comprising:

means, coupled to the drain electrode of the first MESFET, for supplying a substantially constant current to said first MESFET.

12. The combination of claim 11 wherein the second MESFET further comprises drain electrode means for receiving a second reference potential, and further comprising:

a diode coupled between the source electrode of the second MESFET and the output terminal; and means, coupled to the output terminal, for supplying said diode and said second MESFET with substantially constant current.

13. A shift register comprising a plurality of memory cells serially cascaded along a signal bus, each one of the memory cells comprising:

(a) a pair of cascaded circuits, each one of the pair of circuits comprising:

(i) a first MESFET having control electrode means for receiving an input signal;

(ii) a second MESFET having an output electrode coupled to an output terminal through a P-N junction, the output terminal of the first one of the pair of circuits being coupled to the control electrode of the first MESFET of the second one of the pair of circuits;

(iii) means, including a third MESFET having: control electrode means for receiving a control signal; an input electrode coupled to an output electrode of the first MESFET; and, an output electrode coupled to a control electrode of the second MESFET, for biasing the third MESFET, selectively in response to a control signal, between: a conducting state, to electrically couple the output electrode of the first MESFET to the control electrode of the second MESFET; and, a nonconducting state, to electrically decouple the control electrode of the second MESFET from the output electrode of the first MESFET; and (b) means for coupling a pair of control signals to the pair of cascaded circuits, respectively, the control signal coupled to the first one of the pair of circuits being out of phase with respect to the control signal coupled to the second one of the pair of circuits.

14. A method of shifting an input logic signal through a memory cell, comprising the steps of:
amplifying the input logic signal and inverting the logic state thereof;
storing the amplified and inverted input logic signal;
converting the amplified, inverted and stored input logic signal to an intermediate logic signal having a predetermined level;
amplifying the intermediate logic signal and inverting the logic state thereof;
storing the amplified and inverted intermediate logic signal; and
converting the amplified, inverted and stored intermediate logic signal to an output logic signal having a predetermined level.

* * * * *